(12) United States Patent
Manth

(10) Patent No.: US 7,241,637 B2
(45) Date of Patent: Jul. 10, 2007

(54) METHOD OF PRODUCING LED BODIES WITH THE AID OF A CROSS-SECTIONAL CONSTRICTION

(75) Inventor: Thomas Manth, Aachen (DE)

(73) Assignee: G.L.I. Global Light Industries GmbH, Kamp-Lintfort (DE)

(*) Notice: Subject to any disclaimer, the term of this patent is extended or adjusted under 35 U.S.C. 154(b) by 342 days.

(21) Appl. No.: 10/528,007

(22) PCT Filed: Sep. 15, 2003

(86) PCT No.: PCT/DE03/03060

§ 371 (c)(1),
(2), (4) Date: Mar. 16, 2005

(87) PCT Pub. No.: WO2004/027883

PCT Pub. Date: Apr. 1, 2004

(65) Prior Publication Data

US 2006/0051901 A1    Mar. 9, 2006

(30) Foreign Application Priority Data

Sep. 16, 2002  (DE) ............................ 102 42 947

(51) Int. Cl.
*H01L 21/44* (2006.01)
(52) U.S. Cl. .................. 438/26; 438/127; 257/E21.504
(58) Field of Classification Search ............... 438/26, 438/27, 64, 65, 112, 124, 126, 127; 264/272.11, 264/272.17; 257/E21.504
See application file for complete search history.

(56) References Cited

U.S. PATENT DOCUMENTS

| | | | |
|---|---|---|---|
| 5,427,938 A * | 6/1995 | Matsumura et al. | ........ 438/124 |
| 5,811,132 A | 9/1998 | Rho et al. | |
| 5,964,030 A | 10/1999 | Lee et al. | |
| 5,998,243 A | 12/1999 | Odashima et al. | |
| 6,592,352 B1 * | 7/2003 | Poinelli et al. | ...... 257/E21.504 |
| 2005/0059310 A1 | 3/2005 | Ricking et al. | |
| 2005/0127543 A1 * | 6/2005 | Ricking et al. | ................ 264/4 |

FOREIGN PATENT DOCUMENTS

| | | |
|---|---|---|
| DE | 196 04 492 C | 6/1997 |
| EP | 0 290 697 A | 11/1988 |
| JP | 01 069020 A | 3/1989 |
| JP | 01069019 A * | 3/1989 |
| JP | 01069020 A * | 3/1989 |
| JP | 04 329680 A | 11/1992 |
| JP | 06 216412 | 8/1994 |
| JP | 07 030152 A | 1/1995 |

* cited by examiner

Primary Examiner—Kevin M. Picardat

(57) ABSTRACT

Method of producing light-conducting LED bodies of a free-flowing material by introduction into a mold. Here, the volumetric flow of a free-flowing material, at a distance of the electrode plane from the charging point that is greater than 35% of the distance between the charging point and the mold side of the mold situated opposite the charging point—above the charging point and below the chip plane on the mold side of the charging point, is choked by at least one cross-sectional constriction, while—at a distance that is smaller than or equal to 35% of this distance—choking takes place on the mold side situated opposite the charging point. The present invention develops a method of producing light-conducting LED bodies in which, at customary output capacities of the molding operation, the LED electronics are not damaged.

10 Claims, 3 Drawing Sheets

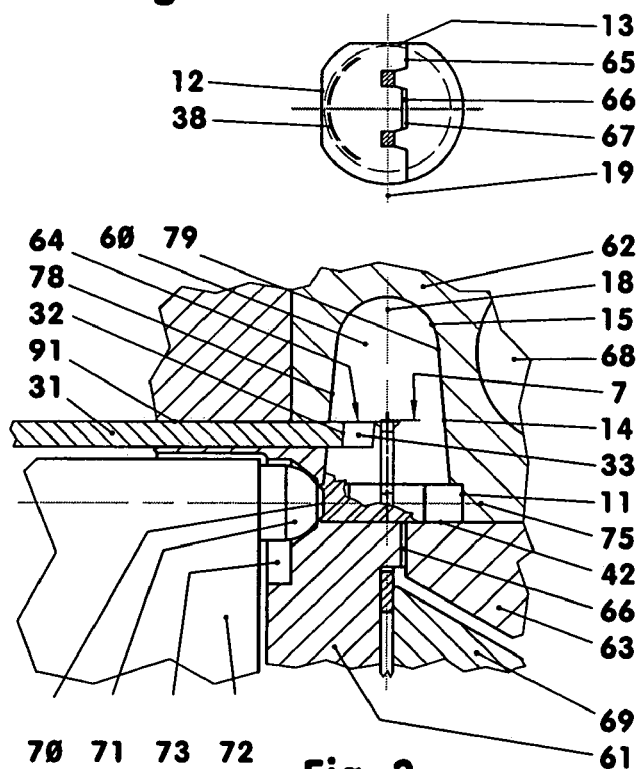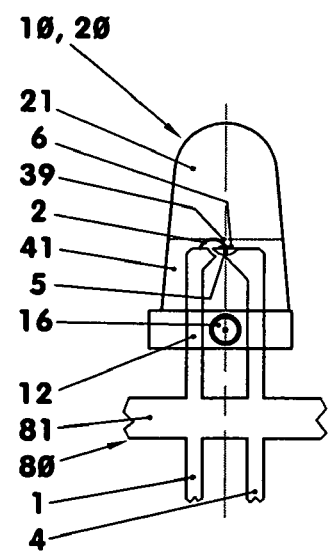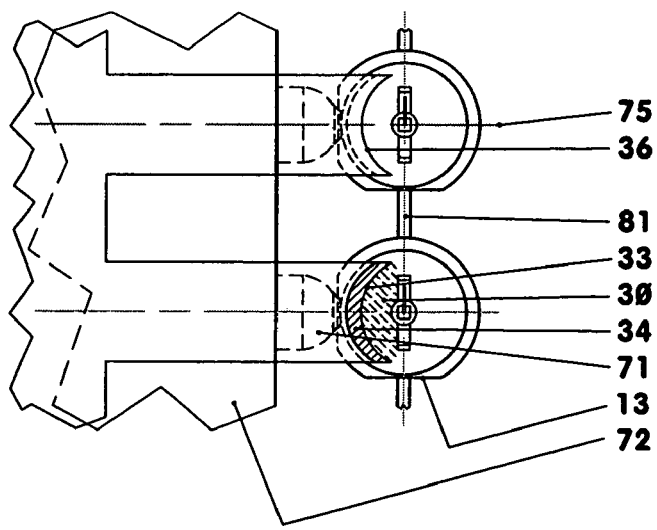

ns filed Sep. 15, 2003
METHOD OF PRODUCING LED BODIES WITH THE AID OF A CROSS-SECTIONAL CONSTRICTION This application is a National Stage of International Application No. PCT/DE03/03060, filed Sep. 15, 2003 which claims priority to DE 102 42 947.2 filed Sep. 16, 2002. The disclosures of the above applications are incorporated herein by reference.

BACKGROUND OF THE INVENTION AND SUMMARY

Method of producing light-conducting LED bodies of a material that is free-flowing before final solidification, by introduction into a mold, where the individual LED body comprises at least one light-emitting chip and at least two electrodes—connected electrically with the chip—and where the free-flowing material is injected between a floor region of the mold and the chip, at least approximately parallel to the chip plane and at least approximately normal to a plane formed by two electrodes, between the electrodes.

DE 101 59 522 discloses a method of this kind for producing light-emitting diodes. The diode to be produced is a radial LED, whose mold is filled by radial injection of free-flowing material. The material is injected under the chip normal to a plane established by the electrodes. In this method, the material filling the mold flows from below around the chip and the bonding wire placed over it. By this method the bonding wire is protected from being torn off by the incoming material. However, it frequently happens that—viewed in the direction of injection of material—the material introduced into the mold piles up on one side before or after the electrodes. As a result, the flow front flowing predominantly toward one side of the chip can push the bonding wire aside hard enough to cause it to come into contact with the cathode. As further flow toward the diode takes place, the component fails due to short circuit.

The present invention therefore is based on the problem of developing a method of producing light-conducting LED bodies in which, at customary output capacities of known injection or molding operations, the LED electronics are not adversely affected.

This problem is solved by the features of the main claim. For this purpose, the volumetric flow of a free-flowing material, at a distance of the electrode plane from the charging point that is greater than 30% of the distance between the charging point and the mold side of the mold lying opposite the charging point—is choked above the charging point and below the chip plane on the mold side of the charging point by at least one cross-sectional constriction, while—at a distance that is smaller than or equal to 30% of this distance—choking takes place on the mold side lying opposite the charging point.

By this method of producing a luminescent diode, a given specification of the charging point and of the direction of introduction in conjunction with a prescribed choking of the volumetric flow of material at a defined spot procures a flow condition that permits controlled, uniform filling of the mold without any damage to the LED electronics. For choking, a molding element that narrows the cross section of flow between the front edge of the molding element and the chip is located in the individual mold cavity opposite the electrode fence. The geometric dimension of the molding element and its surface structure turned toward the volumetric flow is selected according to the type of synthetic material, or as necessary. This is simple to accomplish with the use of replaceable choke slides bearing the molding element.

The molding element causes the in-flowing material to be choked at least on one side in such a way that the flow fronts moving from below against the chip on both sides of the electrodes contact and flow around the chip and the bonding wire virtually simultaneously. The virtually simultaneous envelopment of the bonding wire stabilizes the bonding wire in its structurally preplanned position.

The method is likewise applicable to luminescent diodes having a plurality of chips and electrodes.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

FIG. 3: Side view of an LED in a mold with the molding element slide driven in;
FIG. 4: Front view of the LED in FIG. 3;
FIG. 5: Top view of LED fabrication connections near the injection molding nozzles;
FIG. 6: View from below of the LED in FIG. 1 with a plurality of parting lines.

DETAILED DESCRIPTION OF THE INVENTION

Figure 1:
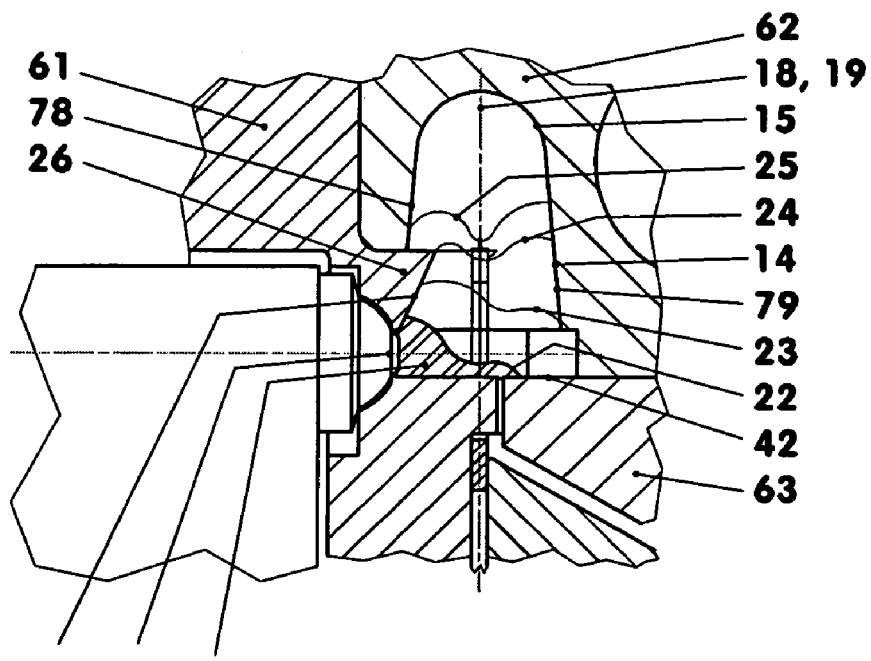
FIG. 1: LED mold with cross-sectional constriction over the point of injection.

FIGS. 3 to 6 show an LED 10 whose light-conducting body 20 is produced for example by molding in one injection molding step.

Here the LED 10 represented has an LED body 20 theoretically divided into two zones 21, 41, cf. FIG. 4. The lower zone 41 of the body 20 is a so-called electronics protective zone, while the upper zone 21 is designated a light-conducting zone. The two zones are separated from each other by an imaginary parting line 39. The parting line 39 is represented dash-dotted only in FIG. 4.

The electronics protective zone 41 as a rule surrounds the electrical connections 1, 4 lying in a plane 19, the light-emitting chip 6, a bonding wire 2 and a reflector basin 5. The latter for example is part of the cathode 4. The chip 6 sits in the reflector basin 5. The chip 6 contacts the anode 1 via the bonding wire 2. There the bonding wire 2 preferably lies in a plane 19, which is established by the center lines of the electrodes 1, 4. The light-conducting zone 21 lying above the chip carries the light emitted by the chip 6 as loss-free as possible to the outer surface 14, 15 of the LED 10.

With respect to its spatial design, the LED body 20 of the exemplary embodiment consists of three geometric bodies 11, 14, 15 placed side by side. The lower geometric body 11 is at least approximately a straight cylinder with two at least approximately parallel faces and for example two plane flattenings 12, 13. The flattenings 12, 13 are parallel to the longitudinal axis 18 of the LED and together enclose a right angle. One flattening 12 is parallel to the electrode plane 19, formed by the center lines of the electrodes 1, 4. The lower face forms the so-called floor region 42. The upper face connects to an upright truncated cone 14, which tapers away from the cylinder 11. A dome 15 sits on the truncated cone 14 as the third geometric body. A tangential transition between the dome 15 and the truncated cone 14 is found for example in the LED longitudinal section.

In the exemplary embodiment, the larger face diameter of the truncated cone 14 measures about 5 mm. It is termed the base size. The taper of the truncated cone 14 is for example 20% of the base size. The total height of the LED 10 corresponds to about 180% of the base size. The height of the cylinder 11, which as a flange-like collar with respect to its radius projects over the truncated cone by about 10% of the base size, measures about 30% of the base size. The depth of the flattenings 12, 13 amounts to about 8% of the base size.

The region of the truncated cone 14 lying above the chip 6 and the dome 15 form the main outlet area.

For LED fabrication the electrodes 1, 4 are part of an as a rule flat, punched, so-called electrode fence 80. Within this fence the electrodes 1, 4 are continuously connected together via crosspieces 81. A fence 80 contains for example 32 electrodes for 16 LEDs 10. The minimum distance apart of the LEDs 10 integrated side by side in the fence 80 amounts to at least 10% of the maximum diameter and/or maximum width of the individual LED 10 in the electrode or fence plane 19. In the exemplary embodiment, the distance apart of the center lines 18 of two neighboring luminescent diodes 10 amounts to about 150% of the base size.

For the injection molding of LEDs 10, a multiple-part mold 61-63 is used, which together with the injection molding nozzle 71 specifies the design of the luminescent diode 10. The major part of the diode 10 to be fabricated is comprised of a slide mold 62. The latter for example forms a seamless main outlet area and the part of the peripheral areas of the electronics protective zone 41 which is turned away from a neighboring base mold 61. The floor region 42 and the remaining peripheral areas of the LED 10, with the exception of a suction channel 66 and the injection molding nozzle system, are locked by the base mold 61 and a lift mold 63, where for example a choke slide 31 is integrated in the base mold 61 of FIGS. 3-8.

The base mold 61 for example is one of the fundamental elements of the injection molding tool. Here, it is fastened to the stationary part of the tool and is not moved upon ejection. It has a recess 73 into which the injection molding nozzle 71 projects sealingly.

In the base mold 61, according to FIGS. 3-8, for each mold cavity 60 a choke slide 31 is inserted into a channel 91, which here is rectangular. The choke slides 31 are joined together for example in their back regions via crosspieces, cf. FIGS. 5 and 8. The direction of movement of the choke slides 31 for example is oriented parallel to the floor region 42 of the LED 10 and normal to the electrode fence 80. With regard to the luminescent diode 10, the upper side of the respective free end of a choke slide 31 is on or just below the chip plane 7.

Depending on the spatial conditions in the mold 61-63, the choke slide 31 may alternatively enclose an angle of 5 to 45° with the electrode fence plane 19. Optionally, the choke slide 31 may alternatively be moved by a pivoting or helical motion within the mold 61-63.

The end of the choke slide 31 projecting into the cavity 60 is termed a molding element 32. Its face turned toward the LED center line 18 is for example a curved spatial surface 33, which corresponds exactly to the cross-sectional area that is produced in a spatial section between the truncated cone 14 and the channel 91, i.e., the curvature corresponds to that of the convex surface of the outer surface 14. In the plane of the drawing of FIG. 3—i.e., in the longitudinal section—the molding element 32 has a trapezoidal cross section. The shearing action of the trapezoidal cross section with respect to the LED center line 18 here corresponds to the angle of the truncated cone 14. In the horizontal top view, cf. FIG. 5 bottom, the surface of the molding element 32 projecting into the cavity 60 is shown hatched. The curved edging of this surface 34 oriented to the LED center line 18 represents the upper edge 36 as a circular arc section.

This upper edge 36, which at the same time is the front edge of the molding element 26, 28, 32, may have any desired curvature, not necessarily plane. In addition, it is capable of being equipped with a flow-influencing structure projecting into the volumetric flow. The structure may be a fluting, a corrugated profile, a knob structure or the like.

Figure 7:
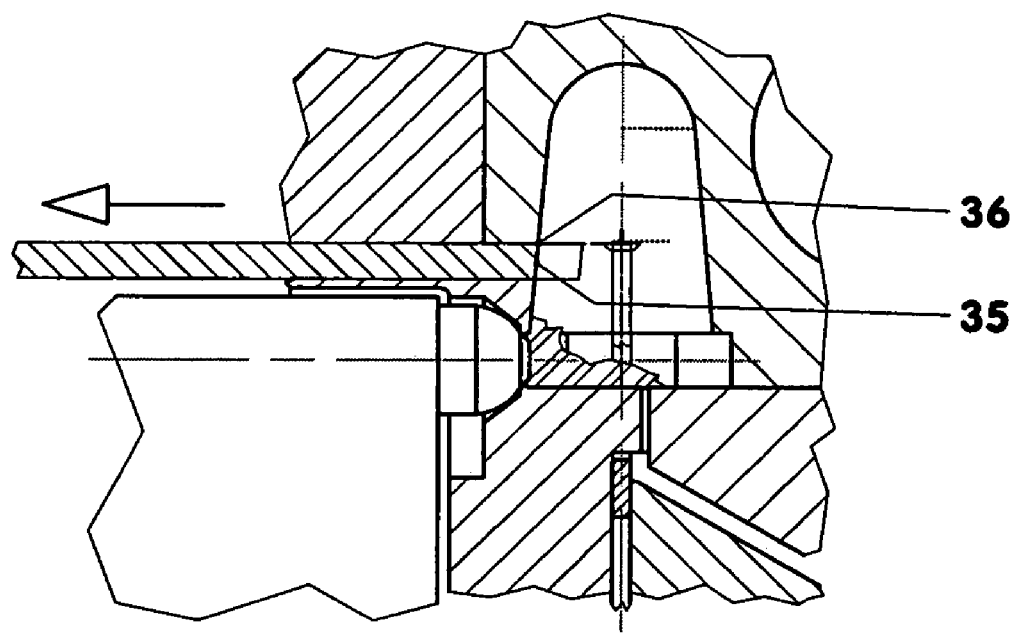
FIG. 7: Side view of an LED in a mold with the molding element slide driven out.
Figure 8:
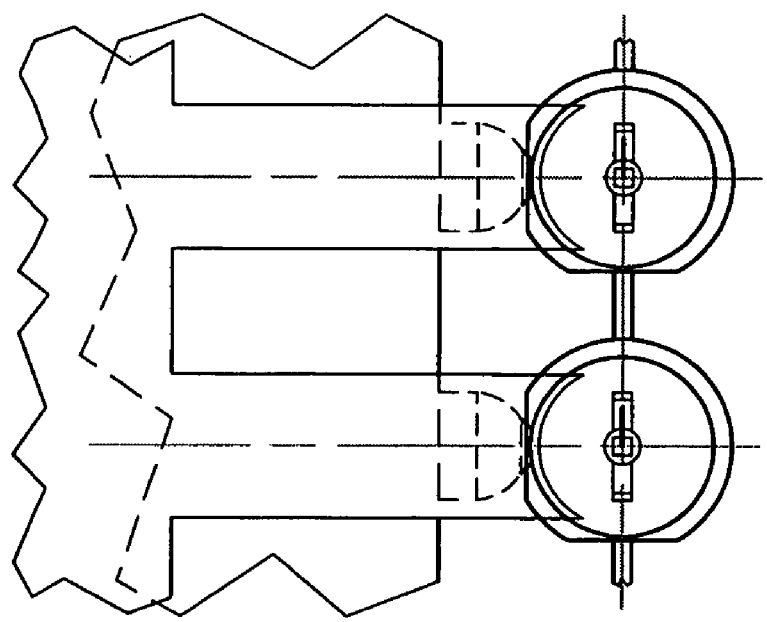
FIG. 8: Top view of FIG. 7, largely without mold.

In the exemplary embodiment of FIGS. 3 and 7, the choke slide 31 adjoins the slide mold 62 regionwise.

In FIG. 1, instead of the choke slide 31, a projection 26 projects into the cavity 60. The projection 26 is part of the base mold 61. The longitudinal-section contour 35 of this projection and/or molding element encloses a 24°-angle with the LED center line 18.

According to FIG. 3, the lift mold 63 is located opposite the base mold 61. According to this representation, for ejection the former is moved away from the base mold 61 toward the right. When the mold 61-63 is closed, the mold parts 61 and 63 touch in a parting line 65 represented in FIG. 6. The parting line 65 is divided in the region between the electrodes 1, 4 to form an aperture 67. The aperture 67 is an edge of the suction channel 66 contacting the floor region 42, cf. FIG. 3. The suction channel 66 is displaced with respect to the electrode plane 19 by several tenths of a millimeter away from the injection molding nozzle 71.

A hold-down device 69 is located in the lift mold 63. The hold-down device 69 is supported displaceable there—for example in the direction of the opening lift of the mold. It clamps the electrode fence 80 against the base mold 61.

The slide mold 62 moves on the plane formed by the mold parts 61, 63, on which the later floor region 42 of the LED 10 rests, and on the contour of the base mold 61 surrounding the injection molding nozzle 71. Between the slide mold 62 and the base mold 61 lies a spatially stepped parting line 64.

The slide mold 62, which surrounds the major part of the future LED surface, is penetrated by at least one tempering channel 68, in order to temper the mold and the other tool parts surrounding it by means for example of water or oil at for example 40-160° C. In FIG. 3, the slide mold 62 is represented only by way of example as one part. For the case that the diode-shaping part is seated within the slide mold 62 in a separate slide support, the latter may alternatively be equipped with the tempering channel. According to FIG. 2, the slide mold 62 optionally bears a projection 28. Its upper edge alternatively lies on or below the chip plane 7.

In preparation for injection molding, the mold 61-63 is opened. For this purpose, the mold parts 63, 69, according to FIG. 3, are moved away to the right. The slide mold 62 is driven by means of a guide, not represented—at an angle of for example 25° with respect to the injection molding nozzle center line 75—obliquely toward the right above to the side. The electrode fence 80, equipped with the chip 6 and the corresponding bonding wires 2, is inserted and centered on the base mold by index pins, not represented. For closing the mold 61-63, the lift mold 63 moves on to the base mold 61. The hold-down device 69 seated in it continues to travel in the direction of closing until the electrode fence 80 is firmly clamped to the base mold 61. By way of example, at the same time the slide mold 62 moves to the molds 61 and 63. The choke slide 31 is now pushed into the cavity 60 so far that the cross-sectional area 30 of the narrowest point between the electrode fence 80, represented hatched in FIG. 5, has reached its minimum. Here, the reduction in cross section may amount to 20-80% of the original cross section.

The cavity of the mold 61-63 to be injected with free-flowing material is evacuated via the suction channel 66 and for example via the gap between the lift mold 63 and the hold-down device 69. The vacuum is maintained during the entire injection molding process.

Immediately after evacuation, the hot free-flowing material 8 or 9 is introduced into the corresponding cavity of the mold 61-63 via the respective injection molding nozzle 71, for example a so-called torpedo nozzle. The center line 75 of the injection molding nozzle 71 and of the stream emerging from it is here aligned normal to the electrode plane 19. It lies between the floor region 42 and the lowermost point of the reflector basin 5. In the exemplary embodiment the center line 75 is located at half the height of the cylinder 11. At the same time, it runs midway between the electrodes 1, 4, cf. FIGS. 5 and 8.

Figure 2:
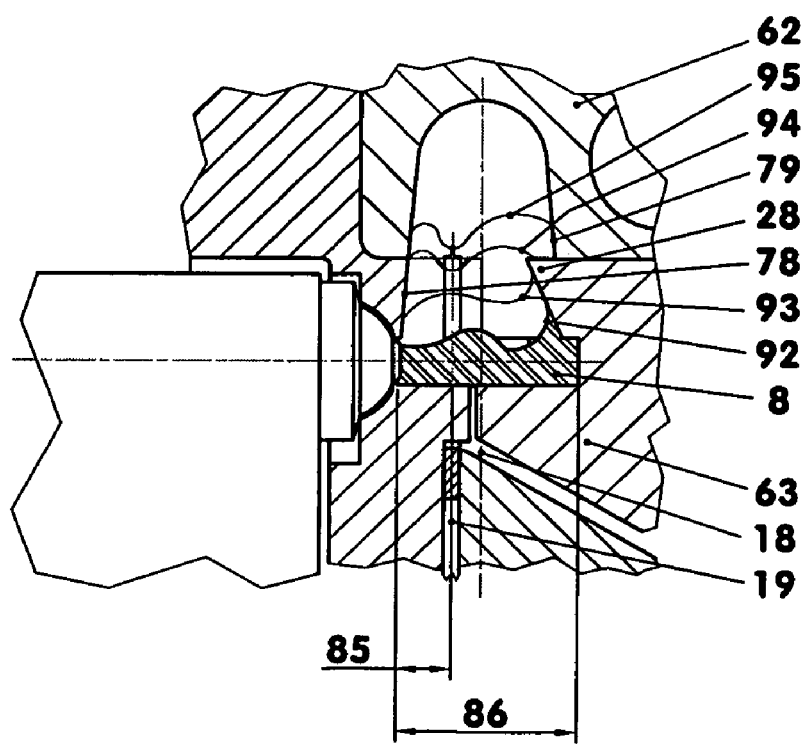
FIG. 2: LED mold with cross-sectional constriction opposite the point of injection.

According to FIG. 2, during the injection molding operation, the liquid synthetic material 8, for example a transparent, optionally colored thermoplastic capable of injection, such as modified polymethylmethacrylimide (PMMI), is shot into the evacuated, tempered mold 61-63 at a pressure of 700±300 bar. The flow rate is for example 0.2 to 10 millimeters per second. The stream passes the electrodes 1, 4 is placed toward the charging point 70—by a distance calculated from the difference between the inside distance 86 and the distance 85—midway and divides at the wall of the mold 62 lying opposite the charging point 70. In doing so, the stream loses so much energy that the incoming synthetic material, upon filling up the cavity, cf. FIG. 1, flows from below upward before and after the electrode plane 19. Choking of the volumetric flow produced by the projection 28 forces an approximately uniform movement upward of the flow front 92-95 in front of and behind the electrode fence 80. Between the positions 94 and 95 of the flow front, the rapidly flowing material 8 reaches the bonding wire 2 before and after the electrode fence 80 at the same time and with a direction of flow that runs parallel to the LED center line 18. The flow proceeds around the bonding wire 2 without altering its prescribed position. The bonding wire 2 is neither pushed to the side nor torn off.

If the material 8 or 9 is introduced into a mold in which the electrodes 1, 4 or the electrode plane 19 are or is moved from the charging point further than 35% of the distance 86 between the mold sides 78 and 79, for example at a central position within the mold 61-63, molding elements 26, 32 that lie directly above the charging point 70 are used for choking the volumetric flow, cf. FIGS. 1, 3 and 7. Here, the material 8, 9 piles up before the electrode fence 80 and moves—without a corresponding molding element 26, 28—faster upward there than behind the fence 80. When the molding elements 26, 32 are used, the respective material 8, 9 moves, at least in the region of the bonding wire 2, past the chip 6 at virtually the same time. In this flow around the chip, the optimal position of the bonding wire 2 likewise is not altered.

In the device of FIGS. 3-8, after complete preliminary filling of the mold, the pressure of the material is maintained and the choke slide 31 pulled back all the way to the outer contour 14 of the LED 10. As a result, the space freed up by the choke slide 31 fills up.

After injection molding and ejection, in a separating operation the crosspieces 81 between the luminescent diode 10 and the electrodes 1, 4 of the individual LEDs 10 are removed by for example stamping.

The invention claimed is:

1. A method of producing light-conducting LED bodies of a material that is free-flowing before the final solidification comprising the steps of:
   providing a mold having a floor region and a charging point, one or more individual LED bodies each having at least one-light emitting chip and at least two electrodes connected electrically with said chip;
   injecting free-flowing material between said floor region of said mold and said chip at least approximately parallel to said chip plane and at least approximately normal to a plane formed by said two electrodes;
   choking by at least a cross-sectional constriction said free-flowing material above said charging and below said chip plane on the mold side of said charging point when a first distance measured by volumetric flow between said electrode plane and said charging point is greater than 35% of a second distance measured by the volumetric flow between said charging point and said mold side of said mold situation opposite said charging point; and
   choking on said mold side opposite said charging point when said first distance is smaller than or equal to said second distance.

2. The method according to claim 1 wherein said cross-sectional constriction is produced by a projection of said mold projecting into a cavity of said mold.

3. The method according to claim 2 wherein said projection is part of a slide which is moved into the cavity of said mold and supports injecting said free-flowing material.

4. The method of claim 3 further comprising the step of:
   moving said slide at least partially back to or behind an outer contour of a luminescent diode of said LED wherein the movement of said slide reduces said volumetric flow of said pre-flowing material and makes a facial surface of said mold turn toward a center line of said LED.

5. The method according to claim 3 wherein said slide is pushed in before said step of injection said free-flowing material and is continuously moved back during charging, over the entire injecting operation.

6. The method of claim 2 wherein said cross-sectional constriction is produced by said projection projecting wedge-like into said mold.

7. The method of claim 2 wherein a contour of a spatial surface of said mold is turned toward the LED center line enclosing an angle of 5 to 45 degrees with the LED center line, while the point of interception between the prolongation of said contour and said LED center line lies above said chip plane.

8. The method of claim 2 wherein said cross-sectional constriction is produced by a crescent or circular arc projection.

9. The method claim 2 wherein a spatial surface of the molding element is turned toward the LED center line is a surface part of the outer contour of a luminescent diode of said LED.

10. The method according to claim 2 wherein the point of the upper edge of said molding element that comes nearest to the LED center line lies on or below said chip plane.

* * * * *